United States Patent
Hikmet et al.

(10) Patent No.: US 8,866,380 B2
(45) Date of Patent: Oct. 21, 2014

(54) LIGHT-EMITTING ARRANGEMENT WITH ORGANIC PHOSPHOR

(75) Inventors: Rifat Ata Mustafa Hikmet, Eindhoven (NL); Johannes Franciscus Maria Cillessen, Deurne (NL); René Theodorus Wegh, Veldhoven (NL)

(73) Assignee: Koninklijke Philips N.V., Eindhoven (NL)

(*) Notice: Subject to any disclaimer, the term of this patent is extended or adjusted under 35 U.S.C. 154(b) by 23 days.

(21) Appl. No.: 13/825,336

(22) PCT Filed: Sep. 20, 2011

(86) PCT No.: PCT/IB2011/054125
§ 371 (c)(1),
(2), (4) Date: Mar. 21, 2013

(87) PCT Pub. No.: WO2012/042434
PCT Pub. Date: Apr. 5, 2012

(65) Prior Publication Data
US 2013/0187537 A1    Jul. 25, 2013

(30) Foreign Application Priority Data

Sep. 28, 2010  (EP) .................................... 10181008

(51) Int. Cl.
| | | |
|---|---|---|
| *H01J 1/62* | (2006.01) | |
| *H01J 63/04* | (2006.01) | |
| *C09K 11/06* | (2006.01) | |
| *H05B 33/14* | (2006.01) | |
| *F21V 31/00* | (2006.01) | |
| *F21V 31/03* | (2006.01) | |
| *H05B 33/04* | (2006.01) | |
| *F21K 99/00* | (2010.01) | |
| *H01L 51/00* | (2006.01) | |
| *F21Y 101/02* | (2006.01) | |

(52) U.S. Cl.
CPC ................ *H05B 33/04* (2013.01); *C09K 11/06* (2013.01); *H01L 51/0053* (2013.01); *F21Y 2101/02* (2013.01); *H05B 33/14* (2013.01); *C09K 2211/1044* (2013.01); *H01L 2251/5361* (2013.01); *F21V 31/005* (2013.01); *F21V 31/03* (2013.01); *F21K 9/56* (2013.01)
USPC ........... 313/504; 313/498; 313/502; 313/503; 313/512

(58) Field of Classification Search
CPC .. C09K 11/06; C09K 2211/1044; F21K 9/56; F21V 31/005; F21V 31/03; F21Y 2101/02; H01L 2251/5361; H01L 51/0053; H05B 33/04; H05B 33/14
USPC .......................... 313/498, 502, 503, 504, 512
See application file for complete search history.

(56) References Cited

U.S. PATENT DOCUMENTS

| | | |
|---|---|---|
| 6,104,137 A | 8/2000 | Abiko et al. |
| 2005/0022865 A1 | 2/2005 | Robeson et al. |
| 2007/0273274 A1 | 11/2007 | Horiuchi et al. |
| 2010/0176409 A1 | 7/2010 | Carretti et al. |

FOREIGN PATENT DOCUMENTS

| | | |
|---|---|---|
| EP | 1641048 A1 | 3/2006 |
| WO | 2009107052 A1 | 9/2009 |

*Primary Examiner* — Thomas A Hollweg
(74) *Attorney, Agent, or Firm* — Meenakshy Chakravorty

(57) ABSTRACT

The invention provides a light-emitting arrangement, comprising: a light source adapted to emit light of a first wavelength; a wavelength converting member comprising an organic wavelength converting compound adapted to receive light of said first wavelength and to convert at least part of the received light to light of a second wavelength, said wavelength converting member and said light source being mutually spaced apart; and a sealing structure at least partially surrounding said wavelength converting member to form a sealed cavity containing at least said wavelength converting member, said sealed cavity containing an inert gas and oxygen gas, the concentration of oxygen gas being in the range of from 0.05 to 3% based on the total volume within said sealed cavity. An oxygen concentration in this range has been found to have very limited influence on the life time of the organic wavelength converting compound.

13 Claims, 4 Drawing Sheets

LIGHT-EMITTING ARRANGEMENT WITH ORGANIC PHOSPHOR

FIELD OF THE INVENTION

The present invention relates to a light-emitting arrangement comprising an organic phosphor maintained under a controlled environment and to a lamp comprising such light-emitting arrangements.

BACKGROUND OF THE INVENTION

Light-emitting diode (LED) based illumination devices are increasingly used for a wide variety of lighting applications. LEDs offer advantages over traditional light sources, such as incandescent and fluorescent lamps, including long lifetime, high lumen efficacy, low operating voltage and fast modulation of lumen output.

Efficient high-power LEDs are often based on blue light emitting materials. To produce an LED based illumination device having a desired color (e.g., white) output, a suitable wavelength converting material, commonly known as a phosphor, may be used which converts part of the light emitted by the LED into light of longer wavelengths so as to produce a combination of light having desired spectral characteristics. The wavelength converting material may be applied directly on the LED die, or it may be arranged at a certain distance from the phosphor (so-called remote configuration). For example, the phosphor may be applied on the inside of a sealing structure encapsulating the device.

Many inorganic materials have been used as phosphor materials for converting blue light emitted by the LED into light of longer wavelengths. However, inorganic phosphors suffer from the disadvantages that they are relatively expensive. Furthermore, inorganic phosphors are provided in the form of particles, thus always reflecting a part of the incoming light, which leads to loss of efficiency in a device. Furthermore, inorganic phosphors have limited quantum efficiency and a relatively broad emission spectrum, in particular for the red emitting inorganic phosphors, which leads to additional efficiency losses. Currently, organic phosphor materials are being considered for replacing inorganic phosphor in LEDs where conversion of blue light to green to red light is desirable, for example for achieving white light output. Organic phosphors have the advantage that their luminescence spectrum can be easily adjusted with respect to position and band width. Organic phosphor materials also often have a high degree of transparency, which is advantageous since the efficiency of the lighting system is improved compared to systems using more light-absorbing and/or reflecting phosphor materials. Furthermore, organic phosphors are much less costly than inorganic phosphors. However, since organic phosphors are sensitive to the heat generated during electroluminescence activity of the LED, organic phosphors are primarily used in remote configuration devices.

The main drawback hampering the application of organic phosphor materials in remote phosphor LED based lighting systems is their photo-chemical stability, which is poor. Organic phosphors have been observed to degrade quickly when illuminated with blue light in the presence of oxygen.

U.S.2007/0273274 (Horiuchi et al.) discloses a translucent laminate sheet comprising a light-emitting device and comprising an organic phosphor arranged in an airproofed space. The space is filled with the organic phosphor in a state where the concentration of oxygen is kept at 100 ppm and preferably at 20 ppm or less in a vacuum or ambient atmosphere of inert gas, to avoid deterioration of the phosphor. However, performing this operation under such low concentrations of oxygen is difficult and costly.

Hence, there remains a need in the art for improved light-emitting devices employing organic phosphor materials.

SUMMARY OF THE INVENTION

It is an object of the present invention to overcome the above-mentioned problems, and to provide a light-emitting arrangement using an organic phosphor in which degradation of the phosphor material is kept at an acceptable level.

According to a first aspect of the invention, this and other objects are achieved by a light-emitting arrangement comprising: a light source adapted to emit light of a first wavelength; a wavelength converting member comprising an organic wavelength converting material adapted to receive light of said first wavelength and to convert at least part of the received light to light of a second wavelength; and a sealing structure at least partially surrounding said wavelength converting member to form a sealed cavity containing at least said wavelength converting member, said sealed cavity containing an inert gas and oxygen gas, the concentration of oxygen gas being in the range of from 0.05 to 3% based on the total volume within the cavity.

The inventors have surprisingly found that oxygen concentrations in said range only slightly influence the decay rate of an organic phosphor. These low oxygen contents at ambient or near ambient pressure is easier to achieve and less costly than hermetic sealing of the phosphor under vacuum or a completely inert atmosphere, as have been suggested previously. In addition, it may be difficult or costly to prevent any outgassing of the wavelength converting member or any other components present within the sealing structure during the lifetime of the device. However, the present invention provides the possibility of maintaining the oxygen concentration at an acceptable level. As a result, the lifetime of the organic phosphor increased. The desired oxygen concentration is typically maintained during the entire lifetime of the light-emitting arrangement.

In embodiments of the invention, the concentration of oxygen gas within the cavity containing the wavelength converting member, i.e. the phosphor, may be in the range of from 0.05 to 1%, and preferably from 0.05 to 0.6%, based on the total gas volume in said sealed cavity. Below a concentration of 0.6%, the influence of the oxygen gas on the phosphor degradation rate is predicted to have a very limited effect on the phosphor degradation rate. For example, a concentration of oxygen gas of 0.1% has been demonstrated to have very little effect on the lifetime of organic phosphors.

According to embodiments of the invention, an oxygen getter may be arranged in the sealed cavity. The oxygen getter enables sealing the cavity containing the phosphor under an atmosphere containing a higher oxygen concentration than desired, and/or using a permeable seal which allows oxygen to enter the cavity at a rate that would without the getter result in an undesirably high oxygen concentration.

In embodiments of the invention the sealing structure comprises a hermetic seal, which is thus impermeable to oxygen gas and other degrading components. Hence, the oxygen concentration within the cavity can easily be maintained at the desired level.

Alternatively, according to other embodiments of the invention the sealing structure may comprise a seal which is non-hermetic and permeable to oxygen. Thus, oxygen permeation into the cavity may be allowed. The concentration of oxygen gas may still be maintained in the desired range, in particular if the oxygen permeation rate is slow and/or if an oxygen getter is used.

According to embodiments of the invention, the wavelength converting material comprises a perylene derivative. Perylene derived phosphors have been found to have particularly good stability in a low oxygen atmosphere. Preferably, the wavelength converting material comprises a compound selected from the group consisting of perylene derivatives of the following general formula:

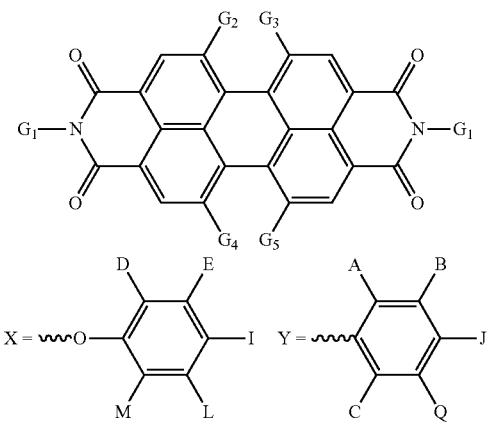

in which $G_1$ is a linear or branched alkyl group or oxygen-containing alkyl group $C_nH_{2n+1}O_m$, n being an integer from 1 to 44 and m<n/2, or Y;

each of A, B, C, J and Q independently is hydrogen, isopropyl, t-butyl, fluorine, methoxy, or unsubstituted saturated alkyl $C_nH_{2n+1}$, n being an integer from 1 to 16;

each of $G_2$, $G_3$, $G_4$ and $G_5$ independently is hydrogen, fluorine, methoxy, or unsubstituted saturated alkyl group $C_nH_{2n+1}$, n being an integer from 1 to 16, or X; and each of D, E, I, L and M independently is hydrogen, fluorine, methoxy, or unsubstituted saturated alkyl group $C_nH_{2n+1}$, n being an integer from 1 to 16.

In one example, $G_1$ is Y. Advantageously, when G1 is Y, each of $G_2$, $G_3$, $G_4$ and $G_5$ is X, each of A and C is isopropyl, and each of B, J, Q, D, E, I, L and M is hydrogen. This wavelength converting compound has been found to have particularly good stability in a low oxygen atmosphere compared to other perylene derived compounds.

According to embodiments of the invention, the wavelength converting member comprises a matrix material. The matrix material may be selected from the group consisting of poly(ethylene terephthalate) (PET), PET copolymers, polyethylene naphthalate (PEN) and PEN copolymers. In particular, incorporating the organic phosphor in a PET matrix has been found to greatly enhance the lifetime of the phosphor. However, other suitable matrix materials may also be used.

According to embodiments of the invention the light source comprises at least one LED. Typically the wavelength converting member and said light source are mutually spaced apart, i.e., the wavelength converting member is arranged in a remote position with respect to the light source.

In another aspect, the invention provides a lamp, e.g. a retrofit lamp, comprising a light-emitting arrangement as described herein.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention. As illustrated in the figures, the sizes of layers and regions may be exaggerated for illustrative purposes and, thus, are provided to illustrate the general structures of embodiments of the present invention.

DETAILED DESCRIPTION

The present inventors have found that oxygen concentrations many times higher than those disclosed in U.S. 2007/0273274 may be acceptable with respect to the rate of degradation of an organic phosphor compound. Quite surprisingly, oxygen concentrations in the range of 0.05-3% were found to be highly acceptable, only slightly increasing the phosphor degradation rate. In particular, the present inventors have found that the degradation rate of a red-emitting organic phosphor in a polymer matrix illuminated with blue light is very little affected by increasing oxygen concentrations as long as the oxygen concentration is approximately 0.6% or below. According to the present invention, the oxygen concentration within a sealed compartment containing the organic phosphor can be maintained at such acceptable level during the entire lifetime of the light-emitting arrangement.

Figure 1:
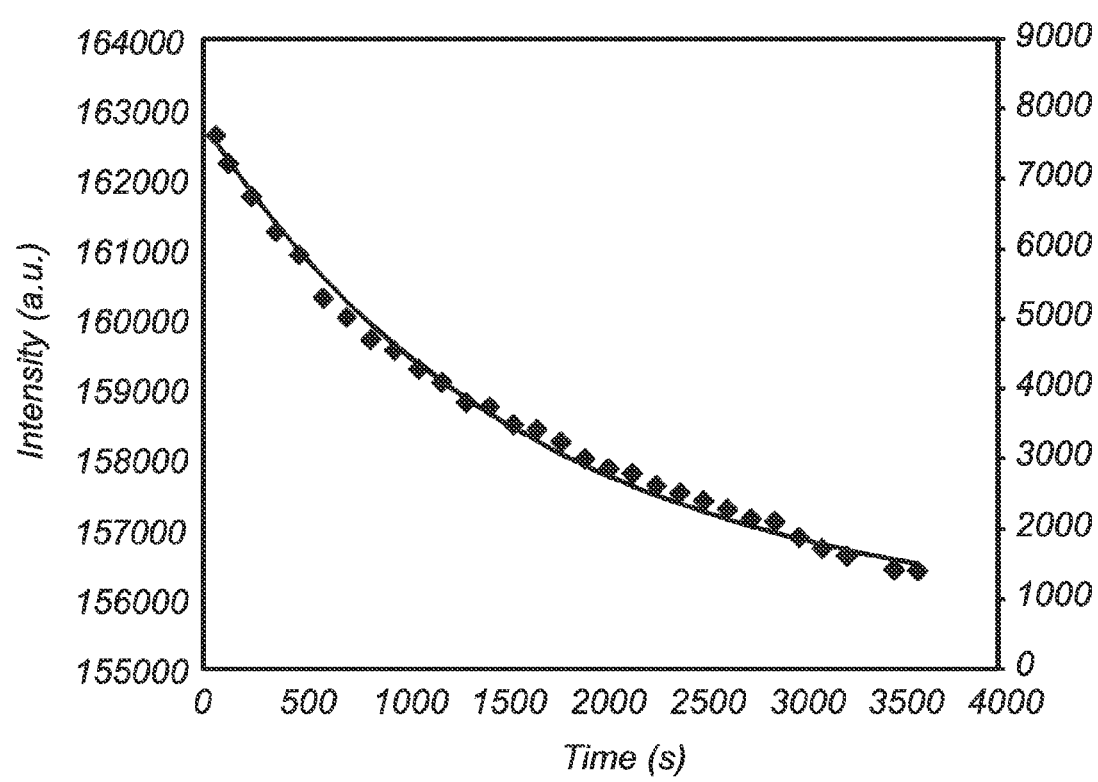
FIG. 1 is a graph showing the decay of an organic phosphor as a function of time.

FIG. 1 is a graph showing, as a function of time, the emission from a layer of organic phosphor represented by 0.1% Lumogen® Red F-305 dye (commercially available from BASF) in PMMA matrix illuminated by a laser emitting light of 450 nm with a flux density of 4.2 W/cm². Due to degradation of the Red F-305 phosphor under blue light irradiation, the emission intensity of the Red F-305 phosphor decreases with time. The initial absorption in the layer was 10% and thus the intensity decrease can be directly related to the concentration of phosphor molecules that have degraded and thus no longer emit light. It can be seen that the change in light intensity is an exponential function of time, $c(t)=c(0)*e^{-kt}$, with a decay constant k representing the degradation rate of the organic phosphor compound.

Next, the decay rate k was measured under illumination with blue light at a flux density of 4.2 W/cm² as a function of temperature for various oxygen concentrations (percentage) in nitrogen. The result is presented in FIG. 2 (logarithmic scale).

Figure 3:
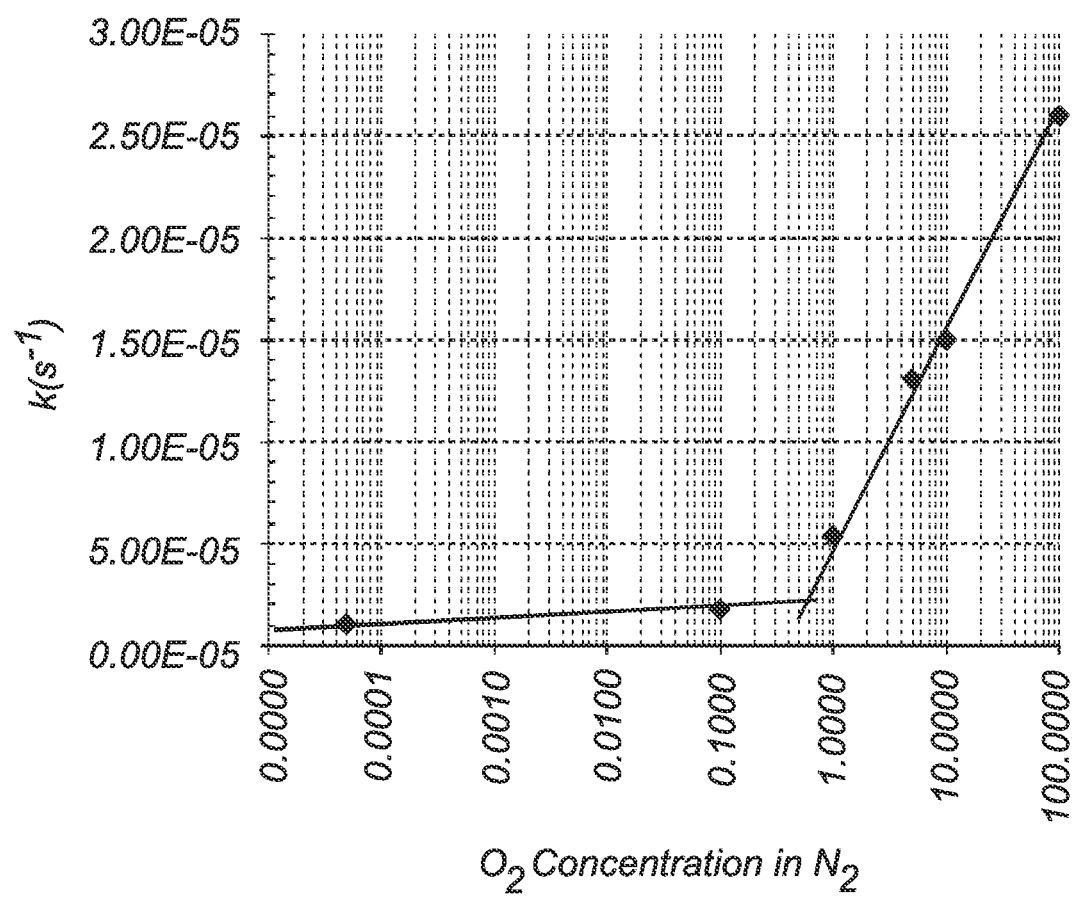
FIG. 3 is a graph showing the decay rate of an organic phosphor measured as a function of oxygen concentration in nitrogen gas.

FIG. 3 is a graph showing the decay rate k of the organic compound measured at 120° C. as a function of oxygen concentration in nitrogen gas on a logarithmic scale. Interestingly, two different regimes can be identified. Up to the measured point of 0.1% oxygen, the decay constant increases very little with increasing oxygen concentration. For the measured concentrations of 1% and above, the decay rate increases rapidly with increasing oxygen concentration. Drawing straight lines through the measured point as illustrated in FIG. 3, these regimes can be clearly seen. Furthermore, these lines intersect at an oxygen concentration of approximately 0.6%.

Hence, it can be predicted that for an oxygen concentration of about 0.6% or lower, the oxygen content will have a very limited influence on the degradation rate of the organic phosphor, whereas for an oxygen concentration of more than approximately 0.6%, the oxygen content will highly influence the phosphor degradation rate.

Figure 2:
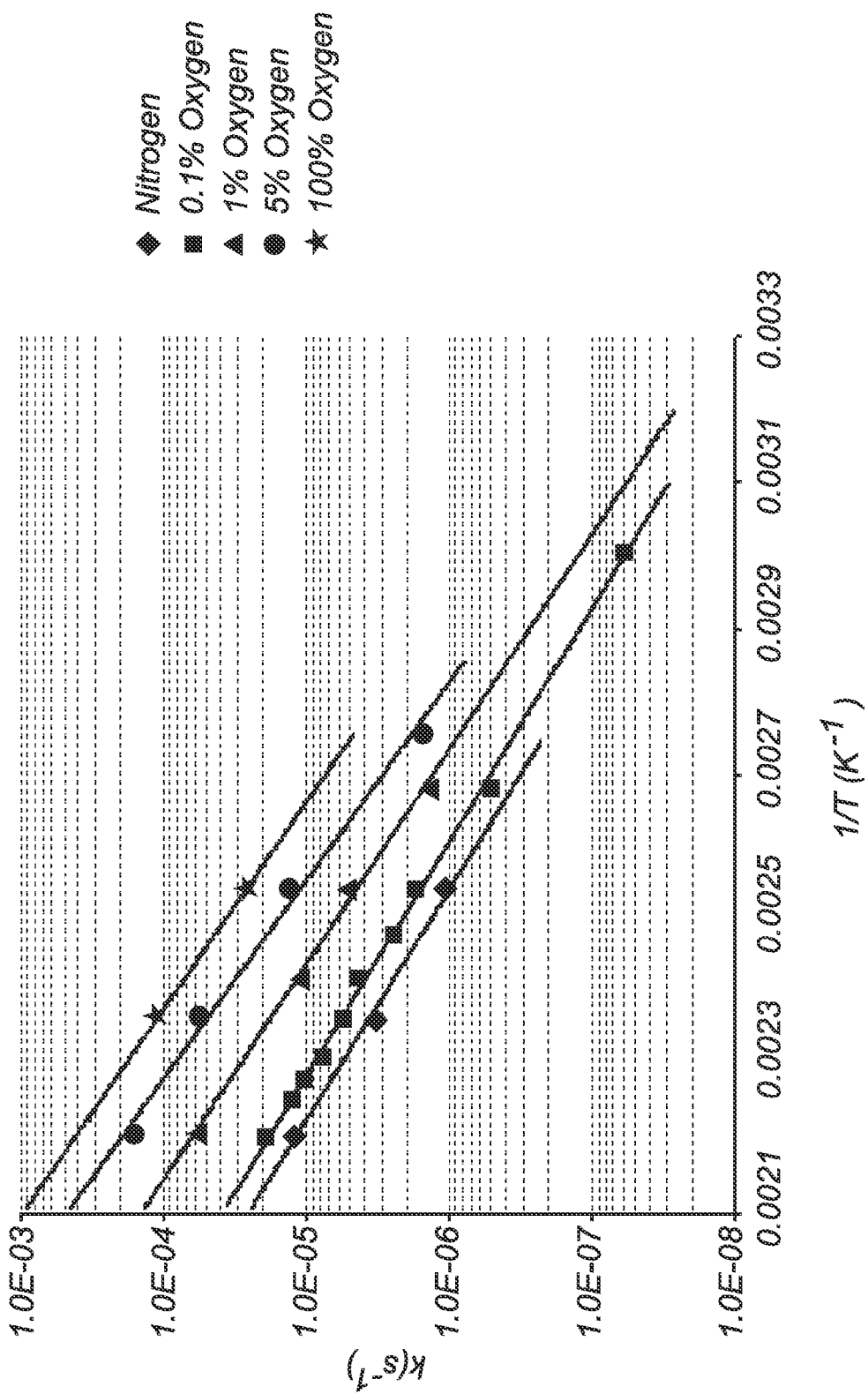
FIG. 2 is a graph showing the decay rate of an organic phosphor as a function of temperature for various oxygen concentration.

The magnitude of the decay constant k depends on the light flux density, the temperature, the oxygen concentration and type of phosphor compound. The flux density and temperature are highly related to the device configuration. It is noted that the light flux density of 4.2 W/cm$^2$ is higher than what is commonly used in LED based lighting devices comprising organic phosphor compounds. Also the temperature of 120° C. is higher than in most remote phosphor applications. Hence, the tests from which the graphs of FIGS. 1 to 3 are obtained represent accelerated conditions.

In view of these insights, it is suggested that an organic phosphor should be kept in a controlled atmosphere containing a limited amount, preferably not more than about 0.6%, of oxygen gas or other degrading gas in otherwise inert gas. However, oxygen concentrations of up to 3%, or even up to 5%, are considered acceptable, since the lifetime of the phosphor then will be sufficient for application at least in certain LED based lighting systems.

Figure 4A:
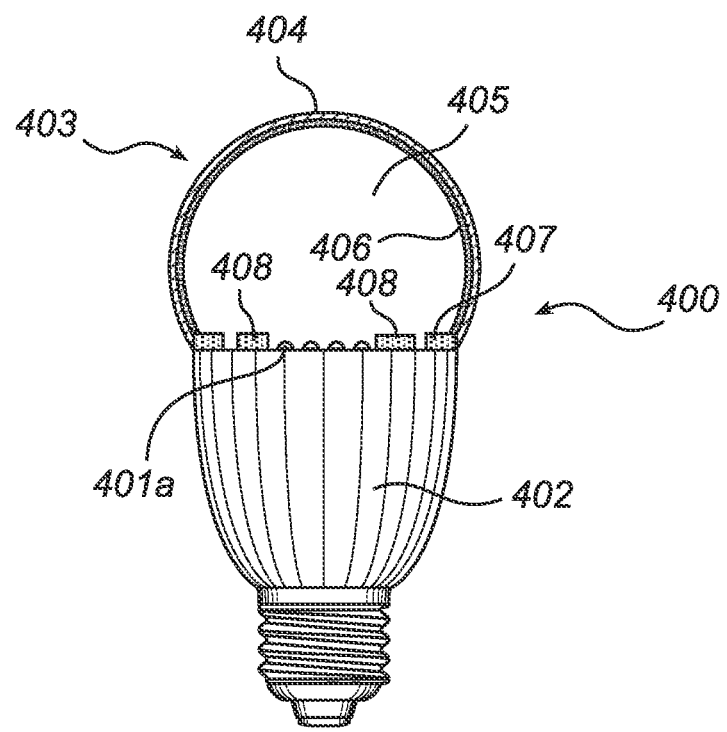
FIGS. 4a and 4b illustrate light-emitting arrangements according to embodiments of the invention.

FIG. 4a schematically illustrates a light-emitting arrangement 400 according to an embodiment of the invention. The light-emitting arrangement 400 of this embodiment is provided as a retrofit lamp. The phrase retrofit lamp is well known to the person skilled in the art and refers to a LED based lamp having an outer appearance of an older type of lamp which did not have a LED. A light source 401 comprising a plurality of LEDs 401a each comprising an electroluminescent layer connected to an anode and a cathode (not shown) is arranged on a base part 402, which is provided with a traditional cap, such as an Edison screw cap or a bayonet cap. A sealing structure 403 comprising a bulb shaped light outlet member 404 is arranged over the LEDs 401a and enclosing a cavity 405. A wavelength converting member 406 comprising an organic wavelength converting compound is arranged within the cavity 405 on the inside of the light outlet member 404 (i.e. on the side of the light outlet member facing the cavity 405) Typically, the wavelength converting compound is dispersed in a polymeric matrix or carrier. The wavelength converting member and the light source are arranged mutually spaced apart, meaning that the wavelength converting member is arranged at a remote position in relation to the LEDs (so-called remote phosphor configuration).

The sealing structure 403 also comprises a seal 407, which extends along the rim of the bulb-shaped light outlet member 404. The seal 407 may be a hermetic seal or a gas-permeable seal. The light outlet member 404 of the sealing structure is formed of a gas impermeable material.

When the seal 407 is a hermetic seal, the sealing structure provides a gas impermeable barrier between the cavity 405 and the outside atmosphere surrounding the sealing structure. According to the present invention, the atmosphere inside the sealing structure, i.e., in the cavity 405, is mainly composed of an inert gas, such as nitrogen or argon but may contain minor amounts of other, non-inert gases, such as oxygen. Alternatively, in embodiments of the invention, the cavity 405 need not be hermetically sealed. In such embodiments, the seal 407 may be permeable such as to allow a low rate of gas (e.g. oxygen) permeation into the cavity 405. A permeable seal is typically an organic adhesive, such as an epoxy adhesive.

It should be noted that throughout this application the sealing structure 403 comprises one or more walls, which may be formed of glass, ceramic, metal or a polymeric material optionally provided with a barrier coating or film. The sealing structure may be at least partly light transmissive. For example, in the embodiment of FIG. 4a the light outlet member is formed of a light transmissive material. In embodiments of the invention, the sealing structure may comprise a plurality of walls or wall portions which may be joined together by an adhesive which may be gas permeable or gas impermeable.

Oxygen may be present in the cavity 405 as a result of sealing under an oxygen-containing atmosphere, and/or it may enter the cavity 405 via a permeable seal, and/or it may be released or produced from a material or component within the cavity 405, e.g. the matrix material of the wavelength converting member, during operation of the light-emitting arrangement.

Figure 4B:
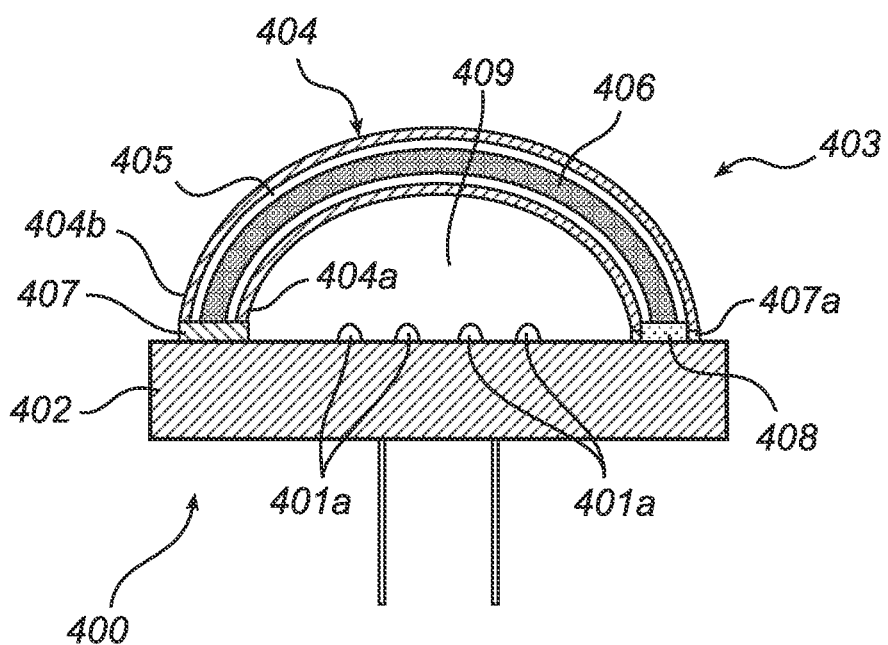

FIG. 4b illustrates a light-emitting arrangement according to another embodiment of the invention. The light emitting arrangement 400 comprises a plurality of LEDs 401a arranged on a base part 402 and a dome shaped sealing structure 403 comprising a light outlet member 404 covering the LEDs 401a. However, in this embodiment the light outlet member comprises a sandwich structure of an inner wall 404a forming an inner barrier, and an outer wall 404b forming an outer barrier, and the remote wavelength converting member 406 arranged between the outer wall 404b and the inner wall 404a. The outer and inner walls 404b, 404a are connected with the base part and with each other by means of the seal 407 extending along circumferential edge portions of the inner and outer walls. The light outlet member 404 thereby forms the sealed cavity 405 between the mutually spaced inner and outer walls 404a, 404b. The sealed cavity 405 containing the wavelength converting member is separate from the compartment 409 formed by the sealing structure 404 and the base part 402 and containing the LEDs 401a. Since there are no particularly oxygen sensitive components within the further compartment 409 it does not require a special environment or atmosphere, but may contain air. However it is also possible to initially provide the compartment 409 with the same atmosphere as the cavity 405, since the compartment 409 is in fact sealed from the environment by the seal 407, because it is additionally used to attach the light outlet member 404 to the base part 402.

As shown in FIG. 4b, the wavelength converting member is arranged in a remote position in relation to the light source 401.

It is contemplated that two or more wall portions may be used to form the sealing structure 404. Also, the walls 404a, 404b need not be hemispherical, dome-shaped or even curved, but may have any suitable shape, and may for example comprise a plurality of portions.

In accordance with an embodiment of the light emitting arrangement, the sealing structure may comprise a light outlet member formed as a cylindrical tube, e.g. a glass tube, wherein the sealing structure further comprises end caps each attached to the cylindrical tube by means of a seal as described above in relation to FIG. 4a. This embodiment can be arranged as for example a retrofit fluorescent tube, the interior of the tube forming a sealed cavity corresponding to the cavity 405 described above e.g. in relation to FIG. 4a.

The sealing of the cavity 405 may be performed using methods and conditions which reduce the content of degrading gas, such as oxygen, within the cavity. Such methods and conditions are known to person skilled in the art and include vacuum pumping and filling the cavity with an inert gas before sealing thereof; flushing the cavity with an inert gas during sealing thereof; or sealing the cavity in an oxygen-free environment such as in a glovebox.

The wavelength converting member may be a polymeric matrix or carrier for the organic wavelength converting compound. Examples of suitable polymeric material for the matrix comprise poly(ethylene terephthalate) (PET) and copolymers thereof, polyethylene naphthalate (PEN) and copolymers thereof, poly(methyl methacrylate) (PMMA), polystyrene, polycarbonate, silicone, polysiloxane, and acrylate polymers.

The wavelength converting compound used in the device according to the present invention may be any conventional organic phosphor. For example, the wavelength converting compound may be a perylene derivative. In particular, perylene derivatives having the following general formula may be used in the light-emitting arrangement according to the invention:

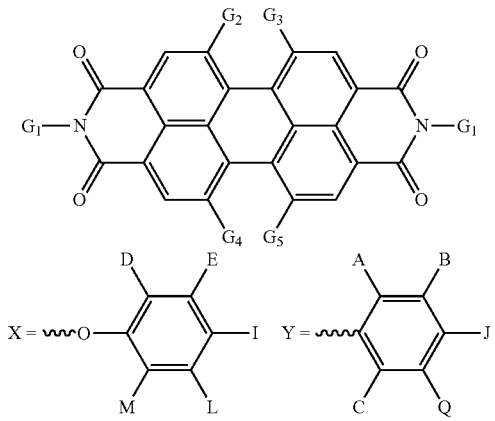

in which $G_1$ is a linear or branched alkyl group or oxygen-containing alkyl group $C_nH_{2n+1}O_m$, n being an integer from 1 to 44 and m<n/2, or Y;

each of A, B, C, J and Q independently is hydrogen, isopropyl, t-butyl, fluorine, methoxy, or unsubstituted saturated alkyl $C_nH_{2n+1}$, n being an integer from 1 to 16;

each of $G_2$, $G_3$, $G_4$ and $G_5$ independently is hydrogen, fluorine, methoxy, or unsubstituted saturated alkyl group $C_nH_{2n+1}$, n being an integer from 1 to 16, or X; and each of D, E, I, L and M independently is hydrogen, fluorine, methoxy, or unsubstituted saturated alkyl group $C_nH_{2n+1}$, n being an integer from 1 to 16.

Typically $G_2$, $G_3$, $G_4$ and $G_5$ independently may be hydrogen or X, and at least one of D, E, I, L and M may be hydrogen. Also, at least one of J and Q may be hydrogen. For example, at least two of D, E, I, L and M may be hydrogen. In one example, $G_1$ is Y. Advantageously, when $G_1$ is Y, each of $G_2$, $G_3$, $G_4$ and $G_5$ is X, each of A and C is isopropyl, and each of B, J, Q, D, E, I, L and M is hydrogen. These wavelength converting compounds have been found to have particularly good stability in a PET matrix.

Typically, at least one of D, E, I, L and M may be hydrogen. For example, at least two of D, E, I, L and M may be hydrogen. Alternatively or additionally, at least one of J and Q may be hydrogen. The function of the moieties A, B, C, J, Q, D, E, I, L and M is to improve the stability of the structure.

Phosphor compounds corresponding to the above general formula were tested and found to have good stability compared to other organic phosphors, including other perylene derived organic phosphors.

In embodiments of the invention, an oxygen getter 408 is provided in the cavity 405, together with the wavelength converting member. By "oxygen getter" is meant a material which absorbs or reacts with oxygen, thus removing oxygen from the atmosphere within the cavity 405.

The getter may be any getter conventionally used in LED phosphor applications. The getter 408 is capable of absorbing a gas which enters the cavity 405. The getter is arranged to absorb a gas that would be detrimental to the organic wavelength converting member 406, in particular the wavelength converting compound. With this structure of the LED device 400 it is possible to provide a non-hermetic seal, i.e. a permeable seal. The getter is typically made of a solid material and arranged adjacent to the seal 407a. The position is chosen inter alia in order to avoid that the getter 408 interferes with an output light path, i.e. the light that is output from the LED device 400. The getter can be placed behind a reflector. The getter itself can also be made reflective. In embodiments of the invention, the getter may be a particulate material, applied in or on a permeable carrier material, e.g. contained in a permeable patch, or applied on an inner surface of the sealing structure for example as a coating.

In embodiments of the invention, in addition to an inert gas, the cavity 405 may contain a further gas which reacts with oxygen in the cavity 405. For example hydrogen gas may be used as an oxygen getter. For instance, LED components or other parts arranged in the cavity 405 may produce a degrading gas which compromises the operation or the lifetime of the light-emitting arrangement 400. It is then possible to choose a reactant gas which reacts chemically with the degrading gas and produces a stable component or a component that can easily be absorbed by an additional getter.

Example

The lifetime of different organic phosphor compounds was tested under different conditions. The compounds used were as follows:

Compound I:

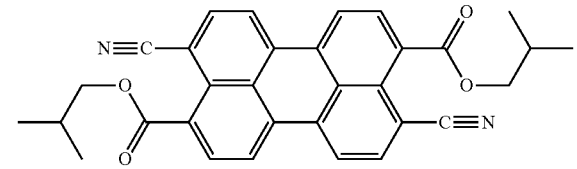 [SMILES: CC(C)COC(=O)c1ccc2c3ccc(C#N)c4c(C(=O)OCC(C)C)ccc(c5ccc(C#N)c1c52)c43]

Compound II:

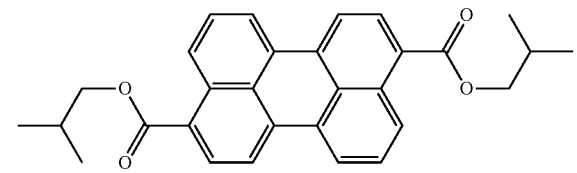 [SMILES: CC(C)COC(=O)c1ccc2c3cccc4c(C(=O)OCC(C)C)ccc(c5cccc1c52)c43]

Compound III:

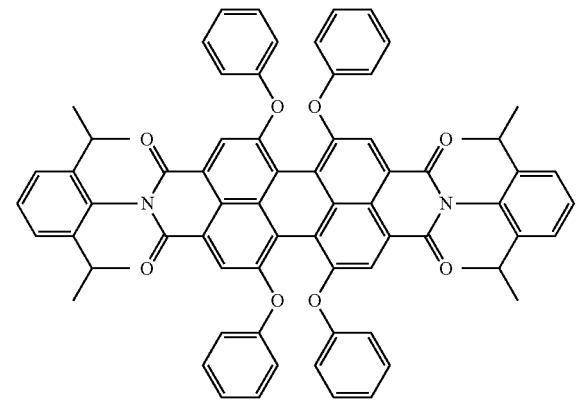 [SMILES: CC(C)c1cccc(C(C)C)c1N1C(=O)c2cc(Oc3ccccc3)c3c4c(Oc5ccccc5)cc5c6c(cc(Oc7ccccc7)c(c7c(Oc8ccccc8)cc(c2c37)C1=O)c64)C(=O)N(c1c(C(C)C)cccc1C(C)C)C5=O]

Compound III is available from BASF as Lumogen® Red F-305 and corresponds to the above general formula in which each of A and C is isopropyl, B is hydrogen and each of D, E, I, L and M is hydrogen.

Each compound was incorporated in two different polymeric matrices, formed into layers, and placed in air or in controlled atmosphere containing 0.1% oxygen. The layers containing the phosphor materials were illuminated with blue light at 4.1 W/cm² at a temperature of 60° C. The phosphor concentration and the layer thickness were chosen such that the transmission of blue light was 90%. The lifetime of the phosphor was estimated as a 10% reduction in the luminescence intensity. The resulting lifetimes are presented in Table 1.

TABLE 1

| Matrix material; atmosphere | Compound I | Compound II | Compound III |
|---|---|---|---|
| PMMA; air | 10 minutes | 3 minutes | 40 hours |
| PMMA; 0.1% oxygen | 2 hours | 7 hours | 500 hours |
| PET; air | minutes | minutes | 300 hours |
| PET; 0.1% oxygen | 6 hours | 5 hours | 3200 hours |

As can be seen in Table 1, the tested compounds showed considerably longer lifetime when kept under an atmosphere containing a reduced amount of oxygen. In particular, Compound III shows extraordinary stability when comprised in a PET matrix and maintained under a low oxygen atmosphere.

The person skilled in the art realizes that the present invention by no means is limited to the preferred embodiments described above. On the contrary, many modifications and variations are possible within the scope of the appended claims.

The invention claimed is:

1. A light-emitting arrangement, comprising:
   a light source adapted to emit light of a first wavelength; and
   a wavelength converting member comprising an organic wavelength converting material adapted to receive light of said first wavelength and to convert at least part of the received light to light of a second wavelength; and
   a sealing structure at least partially surrounding said wavelength converting member to form a sealed cavity containing at least said wavelength converting member, said sealed cavity containing an inert gas and oxygen gas, the concentration of oxygen gas being in the range of from 0.05 to 3% based on the total volume within said sealed cavity, wherein said wavelength converting material comprises a perylene derivative, and wherein the wavelength converting member comprises a matrix material selected from the group consisting of poly(ethylene terephthalate) (PET) and copolymers thereof, polyethylene naphthalate (PEN) and copolymers thereof, poly(methyl methacrylate) (PMMA), polystyrene, polycarbonate, silicone, polysiloxane, and acrylate polymers.

2. A light-emitting arrangement according to claim 1, wherein the concentrate on of oxygen gas within said cavity is in the range of from 0.05 to 1% based on the total volume in said sealed cavity.

3. A light-emitting arrangement according to claim 1, wherein the concentration of oxygen gas within said cavity is in the range of from 0.05 to 0.6% based on the total volume within said cavity.

4. A light-emitting arrangement according to claim 1, wherein the concentration of oxygen gas within said cavity is about 0.1% based on the total volume in said cavity.

5. A light-emitting arrangement according to claim 1, wherein the sealing structure comprises a hermetic seal.

6. A light-emitting arrangement according to claim 1, wherein the sealing structure comprises a seal which is non-hermetic and permeable to oxygen.

7. A light-emitting arrangement according to claim 1, further comprising an oxygen getter arranged in said sealed cavity.

8. A light-emmiting arrangement according to claim 1, wherein said wavelength converting material comprises a compound selected from the group consisting of perylene derivatives of the following general formula:

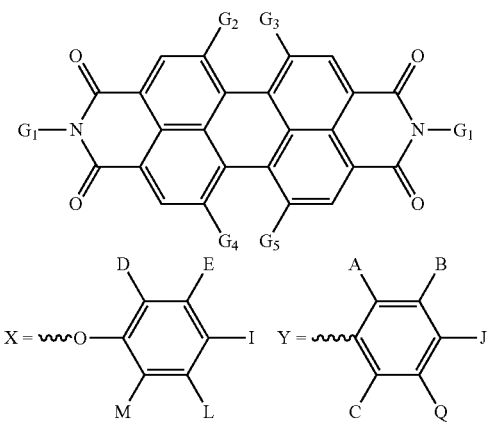

in which
G1 is a linear or branched alkyl group or oxygen-containing alkyl group CnH2n+1Om, n being an integer from 1 to 44 and m<n/2, or Y;
each of A, B, C, J and Q independently is hydrogen, isopropyl, t-butyl, fluorine, methoxy, or unsubstituted saturated alkyl CnH2n+1, n being an integer from 1 to 16;
each of G2, G3, G4 and G5 independently is hydrogen, fluorine, methoxy, or unsubstituted saturated alkyl group CnH2n+1, n being an integer from 1 to 16, or X; and each of D, E, L and M independently is hydrogen, fluorine, methoxy, or unsubstituted saturated alkyl group CnH2n+1, n being an integer from 1 to 16.

9. A light-emitting arrangement according to claim 8, wherein G1 is Y.

10. A light-emitting arrangement according to claim 9, wherein each of G2, G3, G4 and G5 is X, each of A and C is isopropyl, and each of B, J, Q, D, E, I, L and M is hydrogen.

11. A light-emitting arrangement according to claim 1, wherein the wavelength converting member comprises a matrix material selected from the group consisting of poly (ethylene terephthalate), PET copolymers, polyethylene naphthalate (PEN) and PEN copolymers.

12. A light-emitting arrangement according to claim 1, wherein said wavelength converting member and said light source are arranged mutually spaced apart.

13. A lamp comprising a light-emitting arrangement according to claim 1.

* * * * *